United States Patent
Kang et al.

(10) Patent No.: US 8,243,504 B2
(45) Date of Patent: Aug. 14, 2012

(54) PHASE CHANGE MEMORY DEVICE WITH REFERENCE CELL ARRAY

(75) Inventors: Hee Bok Kang, Chungcheongbuk-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 1105 days.

(21) Appl. No.: 12/133,529

(22) Filed: Jun. 5, 2008

(65) Prior Publication Data
US 2009/0027952 A1     Jan. 29, 2009

(30) Foreign Application Priority Data

Jul. 24, 2007   (KR) ........................ 10-2007-0073851

(51) Int. Cl.
*G11C 11/00* (2006.01)
(52) U.S. Cl. ......... 365/163; 365/100; 365/148; 977/754
(58) Field of Classification Search .................... 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| | | | |
|---|---|---|---|
| 6,597,598 B1 * | 7/2003 | Tran et al. ........................ | 365/94 |
| 6,667,900 B2 * | 12/2003 | Lowrey et al. ................ | 365/171 |
| 6,768,665 B2 * | 7/2004 | Parkinson et al. ............ | 365/113 |
| 2002/0041947 A1 * | 4/2002 | Chin et al. .................... | 428/64.4 |
| 2003/0123284 A1 * | 7/2003 | Lowrey et al. ................ | 365/175 |
| 2003/0161178 A1 * | 8/2003 | Tran .............................. | 365/158 |
| 2003/0206473 A1 * | 11/2003 | Tran .............................. | 365/207 |
| 2004/0062074 A1 * | 4/2004 | Ooishi .......................... | 365/158 |
| 2005/0024922 A1 | 2/2005 | Li et al. | |
| 2005/0169038 A1 * | 8/2005 | Inoue et al. ................... | 365/148 |
| 2005/0276091 A1 * | 12/2005 | Inoue ........................... | 365/148 |
| 2005/0276138 A1 * | 12/2005 | Inoue ........................... | 365/210 |
| 2006/0072357 A1 | 4/2006 | Wicker | |
| 2006/0072370 A1 * | 4/2006 | Kuh et al. ..................... | 365/232 |
| 2006/0151849 A1 * | 7/2006 | Czubatyj ...................... | 257/467 |
| 2007/0297221 A1 * | 12/2007 | Philipp et al. ................ | 365/163 |
| 2008/0258129 A1 * | 10/2008 | Toda .............................. | 257/5 |

FOREIGN PATENT DOCUMENTS

| | | |
|---|---|---|
| KR | 1020060100280 A | 9/2006 |
| KR | 1020070060685 A | 6/2007 |

* cited by examiner

*Primary Examiner* — Alexander Sofocleous
*Assistant Examiner* — Harry W Byrne
(74) *Attorney, Agent, or Firm* — Ladas & Parry LLP

(57) ABSTRACT

A phase change memory device includes a plurality of bit lines and a reference bit line intersecting a plurality of word lines. A cell array block has a phase change resistance cell arranged where a word line and a bit line intersect. A reference cell array block is configured to output a reference current and is formed where the word line and a reference bit line intersect. A column selecting unit is configured to select a corresponding bit line connected to the cell array block. A reference column selecting unit is connected to the reference cell array block and is configured to select the reference bit line. A sense amplifier is connected to the column selecting unit and the reference column selecting unit and is configured to receive the reference current and a cell data current of the bit line.

21 Claims, 14 Drawing Sheets

PHASE CHANGE MEMORY DEVICE WITH REFERENCE CELL ARRAY

CROSS-REFERENCE TO RELATED APPLICATIONS

The present application claims priority to Korean Patent Application No. 10-2007-73851 filed on Jul. 24, 2007, which is incorporated herein by reference in its entirety.

BACKGROUND OF THE INVENTION

The present invention relates generally to a phase change memory device, and more particularly to a nonvolatile memory device utilizing phase change resistors and reference cells with improved stability of a reference current and an improved offset characteristic of a sense amplifier.

A nonvolatile memory device is capable of conserving data even when the power of a device is turned off. Examples of nonvolatile memory include a magnetic memory and a phase change memory (PCM). These examples have a data processing speed similar to that of a volatile Random Access Memory (RAM) and can conserve data even after the power is turned off.

FIGS. 1a and 1b are diagrams illustrating a conventional phase change resistor (PCR) 4.

The PCR 4 comprises a phase change material (PCM) 2 interposed between a top electrode 1 and a bottom electrode 3. When a voltage and a current are transmitted through the device, a high temperature is generated in the PCM 2 so that an electric conductive state is changed depending on a change in resistance occurring due to the applied high temperature. The PCM 2 includes AgLnSbTe. The PCM 2 includes a chalcogenide having chalcogen elements (S, Se, Te) as a main ingredient, and more specifically the PCM 2 includes a germanium antimonic tellurium consisting of Ge—Sb—Te.

FIGS. 2a and 2b are diagrams illustrating the operating principles of the conventional PCR 4.

As shown in FIG. 2a, the PCM 2 can be crystallized when a low current of less than a threshold value flows in the PCR 4. The crystallized PCM2 has a low resistance.

As shown in FIG. 2b, the PCM 2 becomes amorphous when a high current of more than a threshold value flows in the PCR 4, since at this time the temperature applied to the PCM 2 is greater than its melting point. The amorphous PCM 2 has a high resistance.

Using this phenomenon, the PCR 4 can be configured to store nonvolatile data corresponding to the two different resistance states. For example, data logic value "1" corresponds to the crystallized PCR 4 (low resistance state), and data logic value "0" corresponds to the amorphous PCR 4 (high resistance state), and accordingly the logic states of the data can be stored using the PCR 4.

FIG. 3 is a diagram illustrating the write operation of a conventional phase change resistance cell.

Heat is generated when current flows between the top electrode 1 and the bottom electrode 3 of the PCR 4 for a given amount of time. As a result, the state of the PCM 2 changes to a crystalline state or an amorphous state depending on the temperature resulting from the current flowing between the top electrode 1 and the bottom electrode 3.

For example, when a low current flows for a given time, the PCM 2 becomes crystalline due to a low temperature heating state, and thus the PCR 4 is at a low resistance state (set state). Conversely, when a high current flows for a given time, the PCM 2 becomes amorphous due to a high temperature heating state, and thus the PCR 4 is at a high resistance state (reset state). The difference between the two phases is determined based on the change in electric resistance.

In the PCR 4, the low voltage required for changing the phase change material to a crystalline state must be applied to the PCR 4 for a long period of time in order to write the set state in a write mode. Conversely, the high voltage required for changed the PCM 2 to an amorphous state need only be applied to the PCR 4 for a short time in order to write the reset state in the write mode.

However, phase change memory devices are not without problems. When the reference voltage of a phase change memory device having a phase change resistor is not effectively controlled the sensing efficiency of a sense amplifier is degraded. As such, the reference current is unstable and the accuracy and the offset characteristic of the sense amplifier are degraded causing deterioration in the data sensing margin and yield of a chip.

SUMMARY

The present invention includes a phase change memory device solving the above described problems.

An embodiment of the present invention provides improved stability and accuracy of reference currents using a reference cell array in a phase change memory device including a phase change resistor.

Additionally, an embodiment of the present invention provides improved sensing efficiency of a sense amplifier using a reference cell array having the same timing delay element in a phase change memory device including a phase change resistor.

Additionally, an embodiment of the present invention improves the offset characteristic of a sense amplifier in a phase change memory device including a phase change resistor.

According to one embodiment, a phase change memory device comprises: a cell array block comprising one or more phase change resistance cells, each phase change resistance cell being formed at an intersection of one or more word lines and one or more bit lines; a reference cell array block configured to output a reference current, reference cell array block comprising one or more reference cells, each reference cell being formed at an intersection of a word line and a reference bit line; a column selecting unit connected to each of the one or more bit lines of the cell array block and configured to select one or more of the one or more bit lines connected to the cell array block; a reference column selecting unit connected to the reference cell array block and configured to select the reference bit line; and a sense amplifier connected to the column selecting unit and the reference column selecting unit and amplifying according to the reference current of the reference cell array block and a cell data current of a bit line selected by the column selecting unit.

According to two embodiment a phase change memory device comprising: a plurality of cell array blocks, each cell array block comprising one or more phase change resistance cells formed at an intersection of a word line and a bit line; a plurality of column selecting units, each column selecting unit being connected to one of the cell array blocks and being configured to select one or more of the one or more bit lines connected to the one cell array block; a single reference cell array block configured to output a reference current, the reference cell array block comprising one or more reference cells, each reference cell being formed at an intersection of a word line and a reference bit line; a reference column selecting unit connected to the reference bit line of the single reference cell array block and configured to select the reference bit line; and a plurality of sense amplifiers, each sense amplifier being connected to one of the column selecting units and the single reference column selecting unit, and each sense amplifier amplifying according to the reference current of the single reference cell array block and a cell data current of a bit line selected by the column selecting unit. According to three embodiment a phase change memory device comprising: a plurality of cell array blocks, each cell array block comprising one or more phase change resistance cells formed at an intersection of a word line and a bit line; a plurality of column selecting units, each column selecting unit being connected to one of the cell array blocks and being configured to select one or more of the one or more bit lines of the connected cell array block; a plurality of reference cell array blocks each reference cell array block corresponding to one of the cell array blocks, wherein each reference cell array block is configured to output a reference current and each reference cell array block comprises one or more reference cells, each reference cell being formed at an intersection of a word line and a reference bit line; a plurality of reference column selecting units, each reference column selecting unit being connected to one of the reference cell array blocks and being configured to select the reference bit line of the connected reference cell array block; and a plurality of sense amplifiers, each sense amplifier being connected to one of the column selecting units and the corresponding reference column selecting unit, and each sense amplifier amplifying according to the reference current of the reference bit line and a cell data current of a bit line selected by the column selecting unit.

DESCRIPTION OF SPECIFIC EMBODIMENTS

Figure 1A:
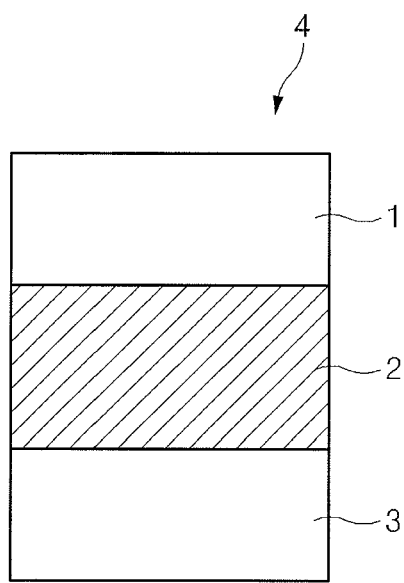
FIGS. 1a and 1b are diagrams illustrating a conventional phase change resistor.
Figure 1B:
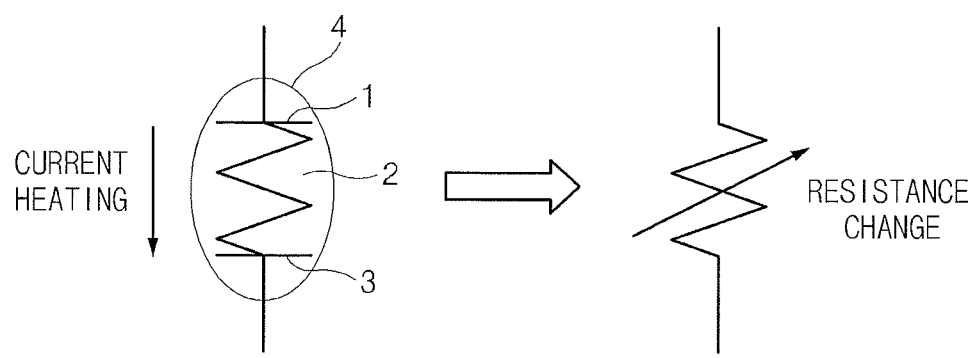
Figure 2A:
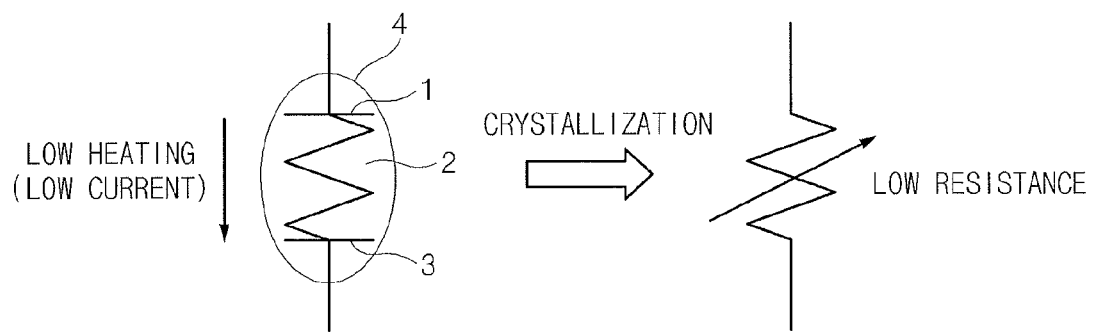
FIGS. 2a and 2b are diagrams illustrating an operating principle of the conventional phase change resistor shown in FIGS. 1a and 1b.
Figure 2B:
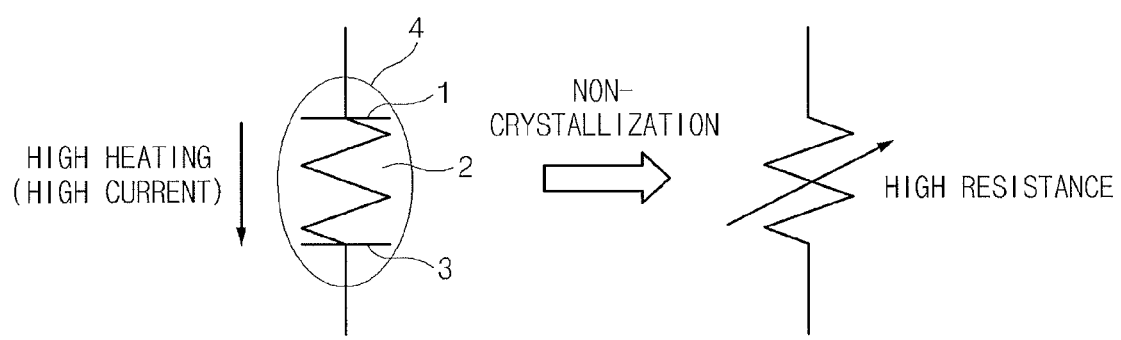
Figure 3:
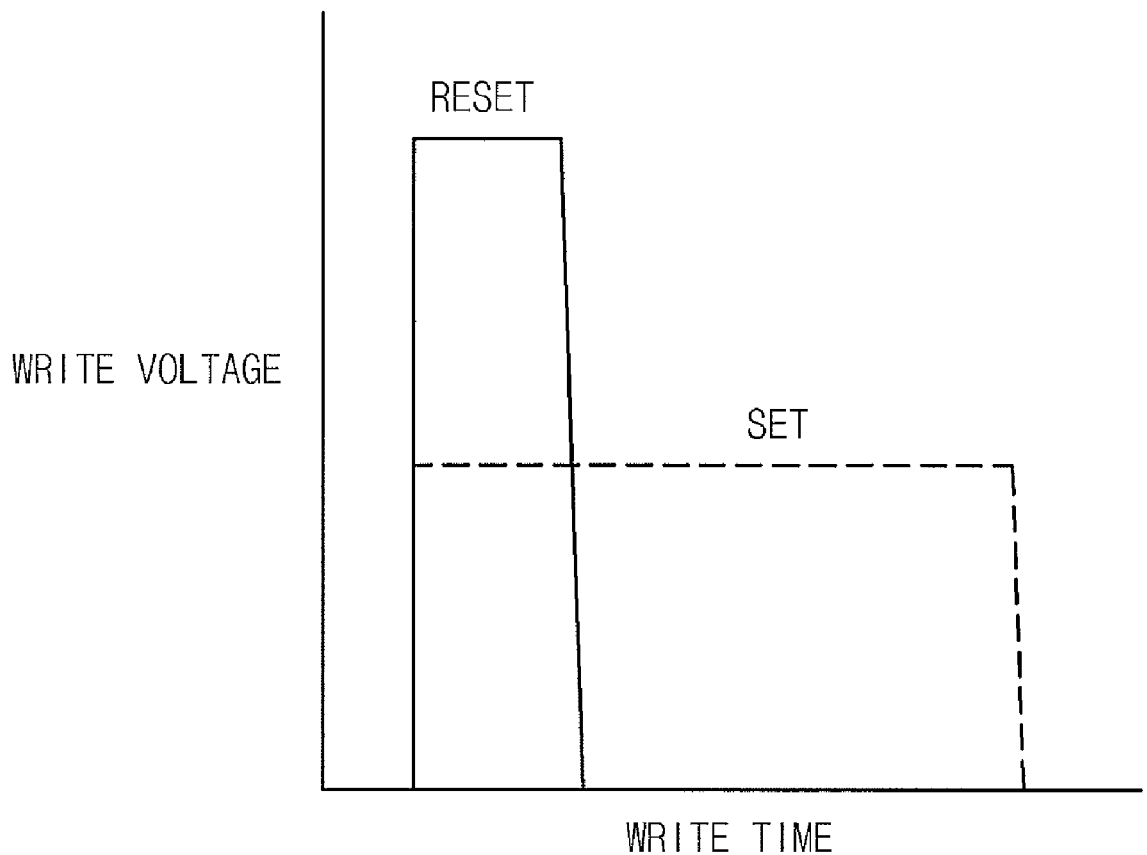
FIG. 3 is a diagram illustrating the write operation of a conventional phase change resistance cell.
Figure 4:
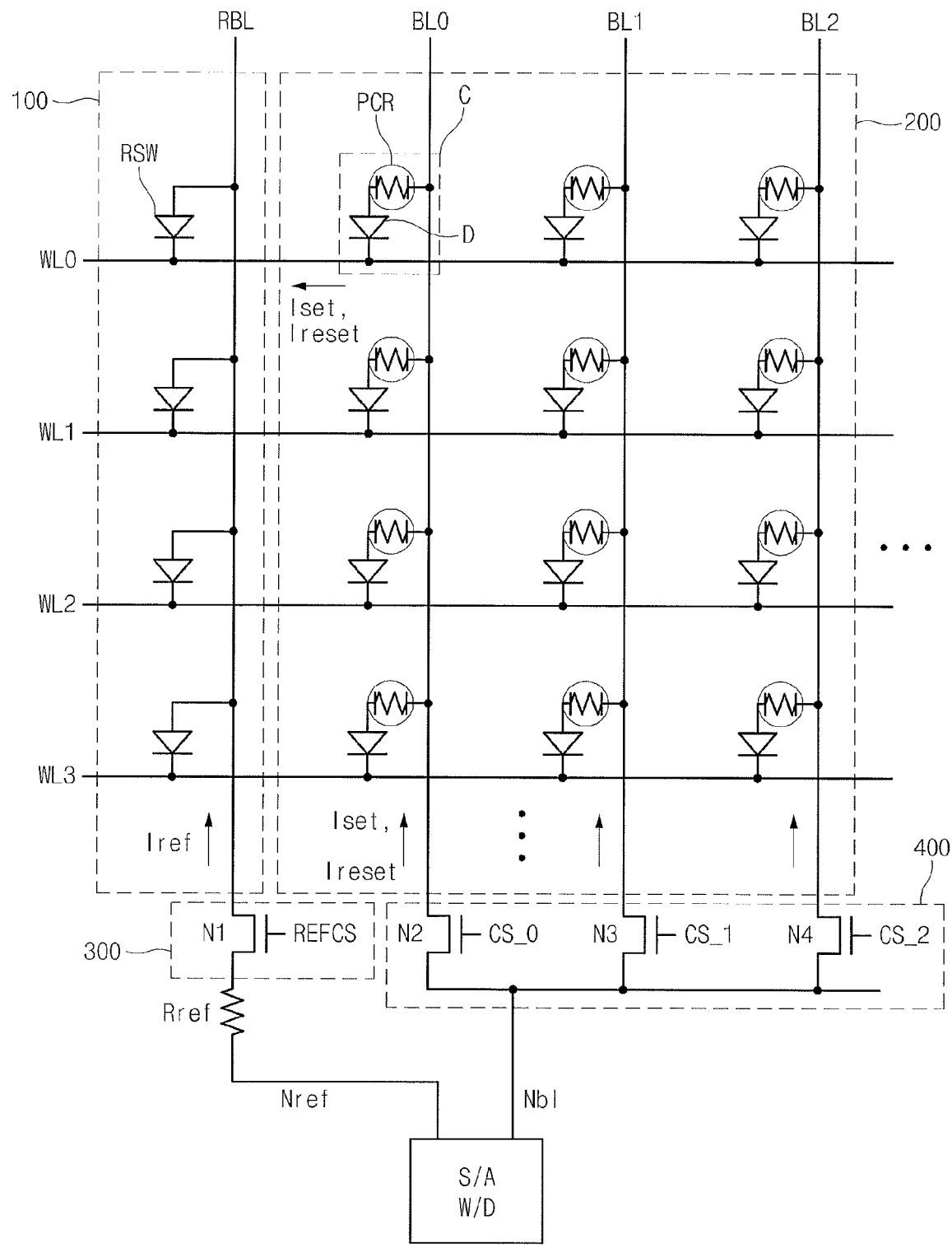
FIG. 4 is a circuit diagram showing a phase change memory device according to an embodiment of the present invention.

FIG. 4 is a circuit diagram showing a phase change memory device according to an embodiment of the present invention.

The phase change memory device of FIG. 4 comprises a reference cell array block 100, a cell array block 200, a reference column selecting unit 300, a column selecting unit 400, a reference resistor Rref, a sense amplifier S/A, and a write driving unit W/D.

The cell array block 200 includes a plurality of bit lines BL0~BL2 arranged in the column direction and a plurality of word lines WL0~WL3 arranged in the row direction. The cell array block 200 includes a plurality of unit cells C arranged where the bit lines BL0~BL2 and the word lines WL0~WL3 intersect. The unit cell C includes a phase change resistor PCR and a diode D. The diode D includes a PN diode element.

One electrode of the phase change resistor PCR is connected to the bit line BL, and the other electrode is connected to the P-type region of the diode D. The N-type region of the diode D is connected to the word line WL. When writing data, the phase of the phase change resistor PCR changed depending on whether the set current Iset or the reset current Ireset is flowing in the bit line BL.

The reference cell array block 100 includes a reference bit line RBL arranged in the column direction and the word lines WL0~WL3 arranged in the row direction. The reference cell array block 100 includes reference switches RSW arranged where the reference bit line RBL and the word lines WL0~WL3 intersect.

The reference switch RSW, which has a cell selecting switch element, includes a PN diode element. The reference bit line RBL is commonly used by the plurality of bit lines BL0~BL2.

The reference switch RSW has a P-type region connected to the reference bit line RBL and an N-type region connected to the word line WL. A reference current Iref flows through the reference bit line RBL.

The reference column selecting unit 300 includes a reference column switch connected between the reference bit line RBL and the reference resistor Rref. The reference column switch has a gate that receives a reference column selecting signal REFCS. The reference column switch includes an NMOS transistor N1. The reference resistor Rref is used for flowing the reference current Iref and is connected between the NMOS transistor N1 and a reference node Nref.

Each bit line BL of the cell array block 200 is connected to the column selecting unit 400. The column selecting unit 400 includes a plurality of column switches. Each column switch is connected between one of the bit lines BL0~BL2 and a node Nbl, and each column switch has a gate that receives one of a plurality of column selecting signals CS_0~CS_2. The column switches include NMOS transistors N2~N4.

The sense amplifier S/A senses cell data transmitted through the node Nbl and the reference node Nref to distinguish a logic data "1" from a logic data "0". The write driving unit W/D supplies a driving voltage corresponding to write data to the node Nbl when data is to be written in a cell.

When in read mode, a low voltage level is transmitted to the selected word line WL, and a read voltage Vread is transmitted to the bit line BL. The sense amplifier S/A amplifies data the set current Iset (or reset current Ireset) flowing in the word line WL and the reference current Iref flowing in the reference cell through the bit line BL, the phase change resistor PCR, and the diode D.

Figure 5:
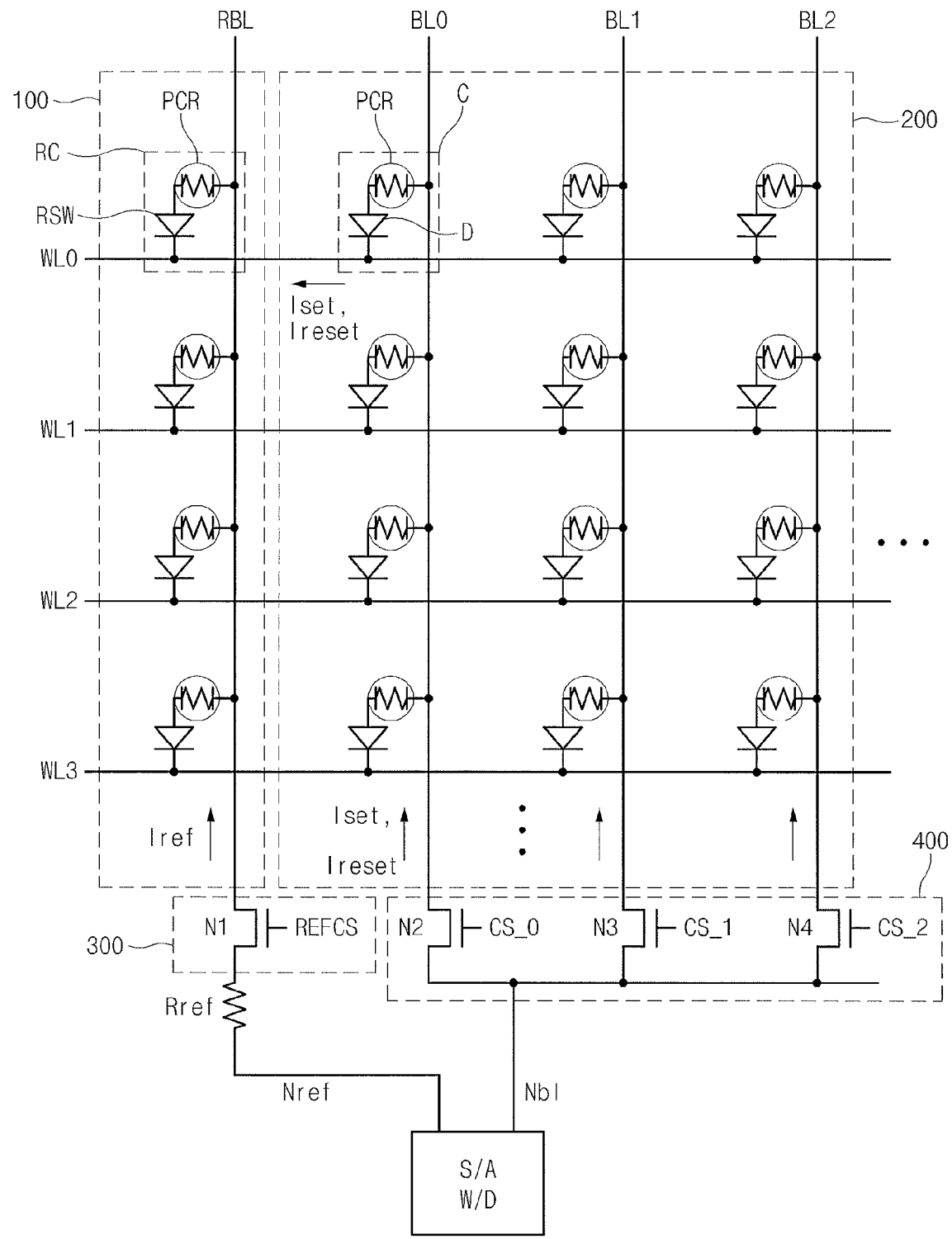
FIG. 5 is a circuit diagram showing a phase change memory device according to an embodiment of the present invention.

FIG. 5 is a diagram showing a phase change memory device according to an embodiment of the invention.

The phase change memory device comprises a reference cell array block 100, a cell array block 200, a reference column selecting unit 300, a column selecting unit 400, a reference resistor Rref, a sense amplifier S/A, and a write driving unit W/D.

The cell array block 200 includes a plurality of bit lines BL0~BL2 arranged in the column direction and a plurality of word lines WL0~WL3 arranged in the row direction. The cell array block 200 includes a plurality of unit cells C arranged where the bit lines BL0~BL2 and the word lines WL0~WL3 intersect. The unit cell C includes a phase change resistor PCR and a diode D. The diode D includes a PN diode element.

One electrode of the phase change resistor PCR is connected to the bit line BL, and the other electrode is connected to the P-type region of the diode D. The N-type region of the diode D is connected to the word line WL. When writing data, the phase of the phase change resistor PCR is changed depending on whether the set current Iset or the reset current Ireset is flowing in the bit line BL.

The reference cell array block 100 includes a reference bit line RBL arranged in the column direction and the word lines WL0~WL3 arranged in the row direction. The reference cell array block 100 includes a plurality of unit reference cells RC arranged where the reference bit line RBL and the word lines WL0~WL3 intersect. The unit reference cell RC includes a phase change resistor PCR and a reference switch RSW. The reference switch RSW, which has a cell selecting switch element, includes a PN diode element.

One electrode of the phase change resistor PCR of the unit reference cell RC is connected to the reference bit line RBL, and the other electrode is connected to the P-type region of the reference switch RSW. The N-type region of the reference switch RSW is connected to the word line WL. A reference current Iref flows through the reference bit line RBL. A common reference bit line RBL is used for each of the plurality of bit lines BL0~BL2.

The reference column selecting unit 300 includes a reference column switch connected between the reference bit line RBL and the reference resistor Rref. The reference column switch has a gate that receives a reference column selecting signal REFCS. The reference column switch includes a NMOS transistor N1. The reference resistor Rref is used for flowing the reference current Iref and is connected between the NMOS transistor N1 and a reference node Nref.

Each bit line BL of the cell array block 200 is connected to the column selecting unit 400. The column selecting unit 400 includes a plurality of column switches. Each column switch is connected between one of the bit lines BL0~BL2 and a node Nbl, and each column switch has a gate that receives one of a plurality of column selecting signals CS_0~CS_2. The column switches include NMOS transistors N2~N4.

The sense amplifier S/A senses cell data transmitted through the node Nbl and the reference node Nref to distinguish a logic data "1" from a logic data "0". The write driving unit W/D supplies a driving voltage corresponding to write data to the node Nbl when data is to be written in a cell.

When in read mode, a low voltage level is transmitted to the selected word line WL, and a read voltage Vread is transmitted to the bit line BL. The sense amplifier S/A amplifies data the set current Iset (or reset current Ireset) flowing in the word line WL and the reference current Iref flowing in the reference cell through the bit line BL, the phase change resistor PCR, and the diode D.

Figure 6:
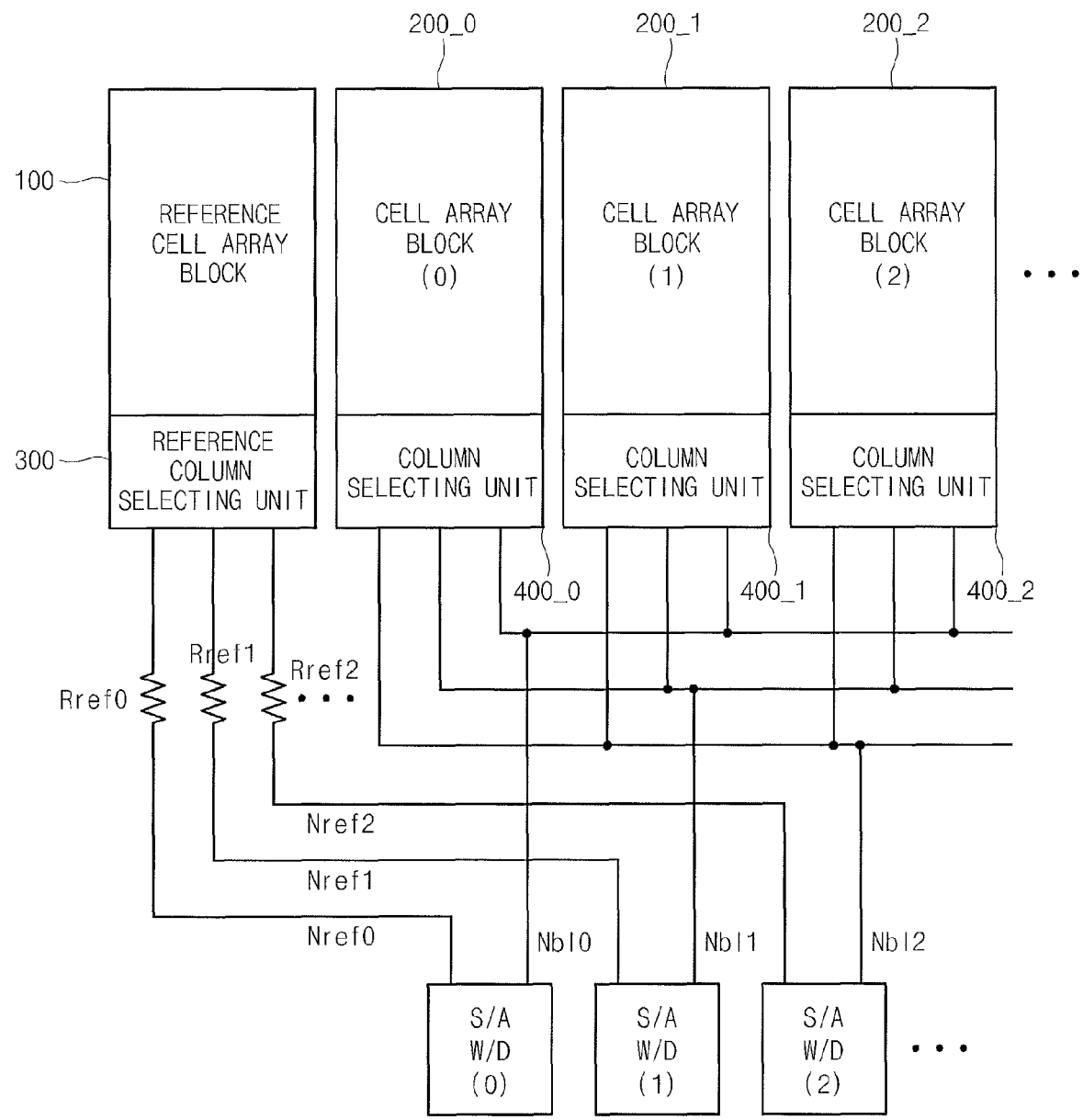
FIG. 6 is a block diagram showing a phase memory device according to an embodiment of the present invention.

FIG. 6 is a block diagram showing a phase memory device according to an embodiment of the present invention.

The phase change memory device comprises a reference cell array block 100, a plurality of cell array blocks 200_0~200_2, a reference column selecting unit 300, a plurality of column selecting units 400_0~400_2, a plurality of reference resistors Rref0~Rref2, a sense amplifier S/A, and a write driving unit W/D.

The reference column selecting unit 300 is connected to the reference cell array block 100 and disposed in a lower region of the reference cell array block 100. The reference column selecting unit 300 and the reference resistors Rref0~Rref2 are arranged at one reference cell array block 100. Each of the column selecting units 400_0~400_2 is connected to one of the cell array blocks 200_0~200_2. Each column selecting unit 400_0~400_2 is arranged in the lower region of the respective one of the cell array blocks 200_0~200_2.

The reference column selecting unit 300 is connected to reference nodes Nref0~Nref2 through the reference resistors Rref0~Rref2. The reference resistors Rref0~Rref2 are connected between the reference column selecting unit 300 and the corresponding reference nodes Nref0~Nref2. Each of the reference nodes Nref0~Nref2 is connected to one of the sense amplifiers S/A and the write driving units W/D. Each of the column selecting units 400_0~400_2 is connected to one of the nodes Nbl0~Nbl2.

The sense amplifier S/A(0) is connected to the node Nbl0 and the reference node Nref0. The sense amplifier S/A(1) is connected to the node Nbl1 and the reference node Nref1. The sense amplifier S/A(2) is connected to the node Nbl2 and the reference node Nref2.

Figure 7:
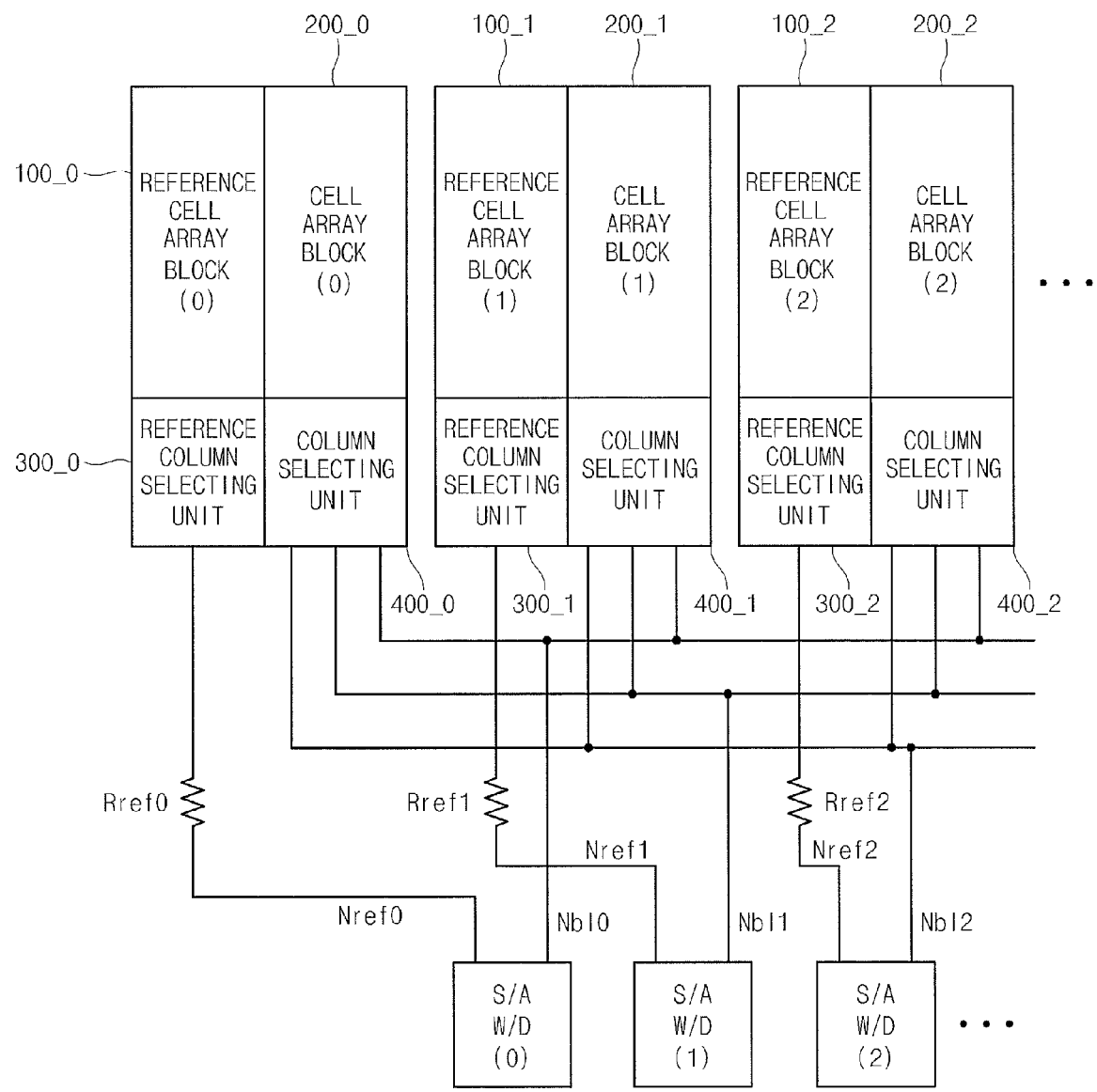
FIG. 7 is a block diagram showing a phase change memory device according to an embodiment of the present invention.

FIG. 7 is a diagram showing a phase change memory device according to another embodiment of the present invention.

The phase change memory shown in FIG. 7 device comprises a plurality of reference cell array blocks 100_0~100_2, a plurality of cell array blocks 200_0~200_2, a plurality of reference column selecting units 300_0~300_2, a plurality of column selecting units 400_0~400_2, and a plurality of reference resistors Rref0~Rref2.

The each of the reference column selecting units 300_0~300_2 is connected to one of the reference cell array blocks 100_0~100_2 (i.e. the reference column selecting units and the reference cell array blocks are connected one by one), and the reference column selecting units 300_0~300_2 are located under the reference cell array blocks 100_0~100_2. The column selecting units 400_0~400_2 are connected one by one to the cell array blocks 200_0~200_2, and the column selecting units 400_0~400_2 are arranged under the cell array blocks 200_0~200_2, respectively.

The reference cell array blocks 100_0~100_2 are disposed at one side of the cell array blocks 2000~200_2. The reference cell array blocks 100_0~100_2 are connected one by one to the cell array blocks 200_0~200_2 (i.e., each reference cell array block 100_0~100_2 corresponds to one of the cell array blocks 200_0~200_2) and thus the number of reference cell array blocks is equal to the number of cell array blocks. Each of the reference column selecting units 300_0~300_2 is disposed at one side of one of the column selecting units 400_0~400_2. The reference column selecting units 300_0~300_2 are connected one by one to the column selecting units 400_0~400_2, and thus the number of reference column selecting units is equal to the number of column selecting units.

The reference column selecting units 300_0~300_2 are connected to corresponding reference nodes Nref0~Nref2 through the reference resistors Rref0~Rref2. The reference resistors Rref0~Rref2 are connected between the reference column selecting units 300_0~300_2 and the reference nodes Nref0~Nref2, respectively.

Each of the reference nodes Nref0~Nref2 is connected to one of the plurality of sense amplifiers S/A(0)~S/A(2) and the plurality of write driving units W/D. The column selecting units 400_0~400_2 are connected one by one to nodes Nbl0~Nbl2.

The reference node Nref0 corresponds to the node Nbl0 and is connected to the sense amplifier S/A(0). The reference node Nref1 corresponds to the node Nbl1 and is connected to the sense amplifier S/A(1), and the reference node Nref2 corresponds to the node Nbl2 and is connected to the sense amplifier S/A(2).

Figure 8:
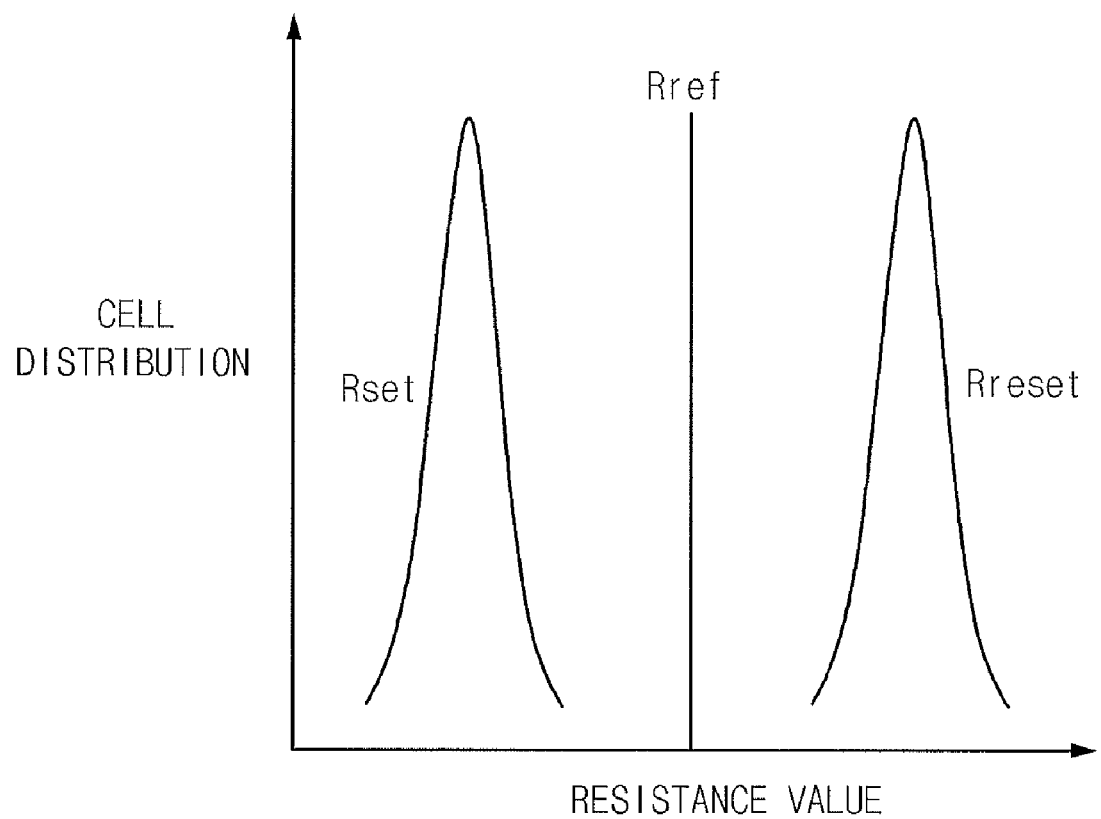
FIG. 8 is a diagram shown for illustrating relationship of a set resistance, a reset resistance, and a reference resistance of a phase change memory device according to an embodiment of the present invention.

FIG. 8 is a diagram shown for illustrating the relationship of a set resistance, a reset resistance, and a reference resistance of a phase change memory device according to an embodiment of the present invention.

As shown in FIG. 8, the set resistance Rset of the bit line BL (a resistance when the phase change layer has a crystalline phase) has a value smaller than that of the reference resistor Rref, and the reset resistance Rreset (a resistance when the phase change layer has an amorphous phase) of the bit line BL has a value larger than that of the reference resistor Rref.

Figure 9:
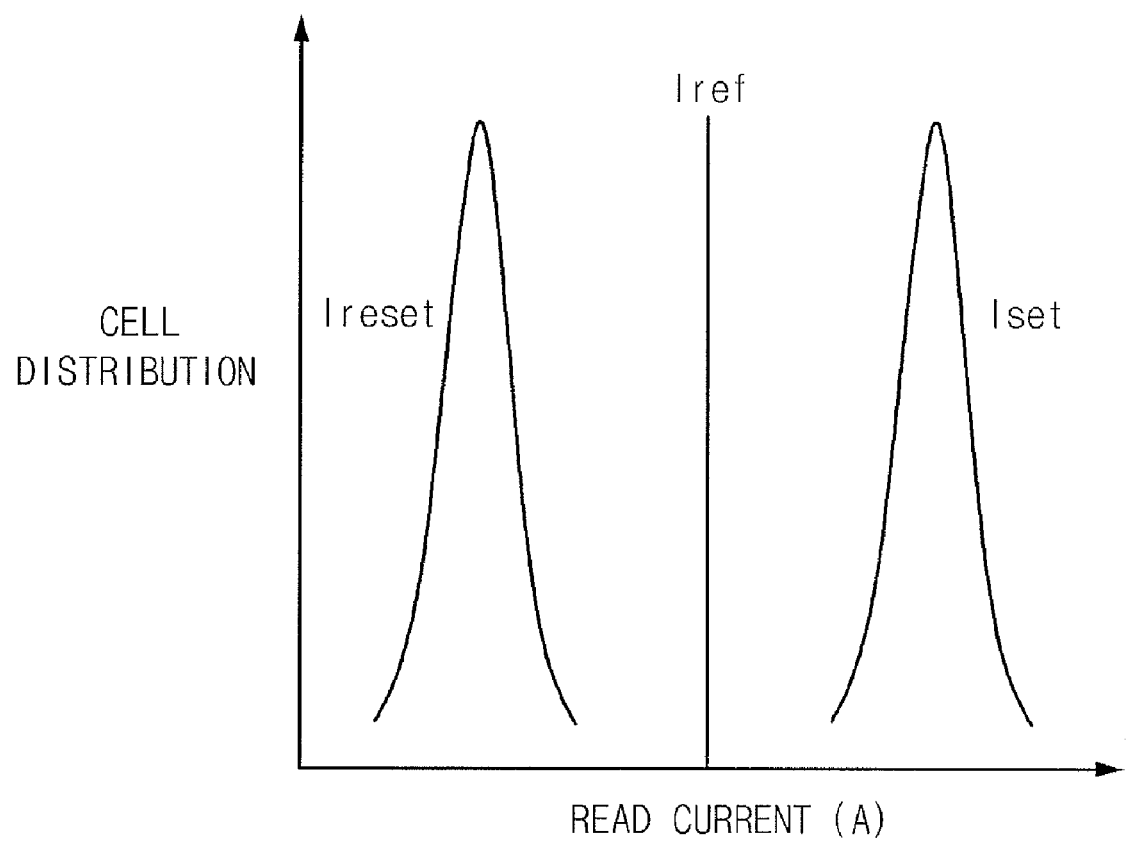
FIG. 9 is a diagram shown for illustrating the relationship of read currents of a phase change memory device according to an embodiment of the present invention.

FIG. 9 is a diagram shown for illustrating the relationship of read currents of a phase change memory according to an embodiment of the present invention.

As shown in FIG. 9, the set current Iset (read current) flowing through the bit line BL has a value higher than that of the reference current Iref, and the reset current Ireset (read current) flowing through the bit line BL has a value lower than that of the reference current Iref.

Figure 10:
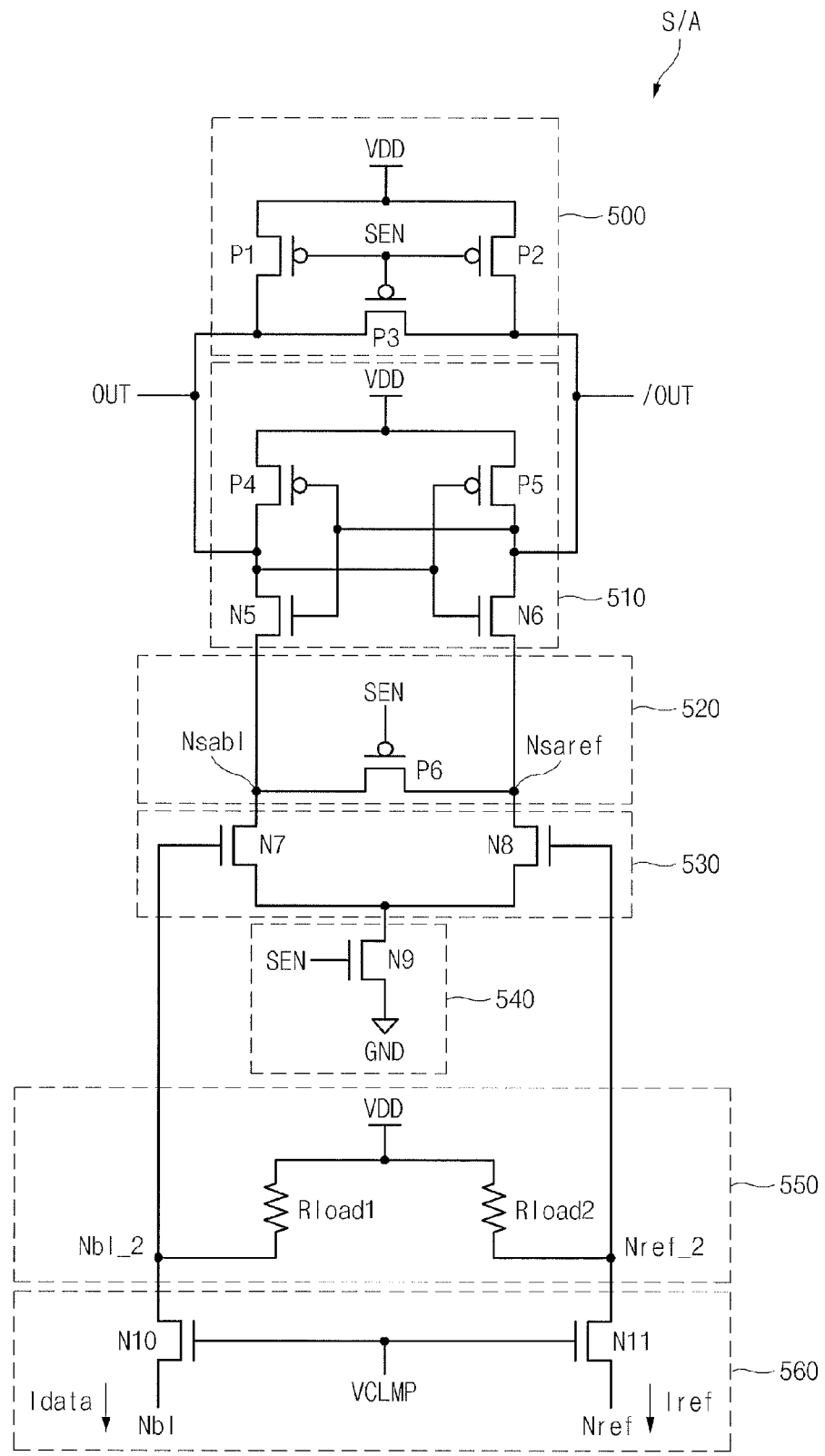
FIG. 10 is a circuit diagram showing an embodiment of the sense amplifier of FIG. 4.

FIG. 10 is a circuit diagram showing the sense amplifier S/A of FIG. 4.

The sense amplifier S/A includes an equalizing unit 500, an amplifying unit 510, a pull-up unit 520, an amplifying unit 530, an amplifying activation control unit 540, a current sense load unit 550, and a bias control unit 560.

The equalizing unit 500 includes PMOS transistors P1~P3. The PMOS transistor P1 is connected between a power voltage VDD terminal and an output terminal OUT. The PMOS transistor P2 is connected between the power voltage VDD terminal and an output terminal /OUT. The PMOS transistor P3 is connected between the output terminals OUT, /OUT. The PMOS transistors P1~P3 have a common gate receiving a sense amplifier enable signal SEN.

The amplifying unit 510 includes PMOS transistors P4, P5 and NMOS transistors N5, N6. The PMOS transistors P4, P5 are cross-coupled with the NMOS transistors N5, N6. A source/drain of the PMOS transistor P4 and the NMOS transistor N5 are connected to the output terminal OUT, and a source/drain of the PMOS transistor P5 and the NMOS transistor N6 is connected to the output terminal /OUT The pull-up unit 520 includes a PMOS transistor P6. The PMOS transistor P6 is connected between a node Nsabl and a node Nsaref and has a gate that receives the sense amplifier enable signal SEN. The node Nsabl is connected to the NMOS transistor N5, and the node Nsaref is connected to the NMOS transistor N6

The amplifying unit 530 includes NMOS transistors N7, N8. The NMOS transistor N7 is connected between the node Nsabl and an NMOS transistor N9 and has a gate connected to a node Nbl_2. The NMOS transistor N8 is connected between the node Nsaref and the NMOS transistor N9 and has a gate receiving a reference voltage Nref_2.

The amplifying activation control unit 540 includes the NMOS transistor N9. The NMOS transistor N9 is connected between the amplifying unit 530 and a ground voltage GND terminal and has a gate receiving the sense amplifier enable signal SEN.

The current sense load unit 550 includes load resistors Rload1, Rload2. The load resistor Rload1 is connected between the power voltage VDD terminal and the node Nbl_2. The load resistor Rload2 is connected between the power voltage VDD terminal and the node Nref_2.

The bias control unit 560 includes NMOS transistors N10, N11. The NMOS transistor N10 is connected between the node Nbl_2 and the node Nbl, and the gate of the NMOS transistor N10 receives a clamp voltage VCLMP. The NMOS transistor N11 is connected between the node Nref_2 and the node Nref, and the gate of the NMOS transistor N11 receives the clamp voltage VCLMP.

Figure 11:
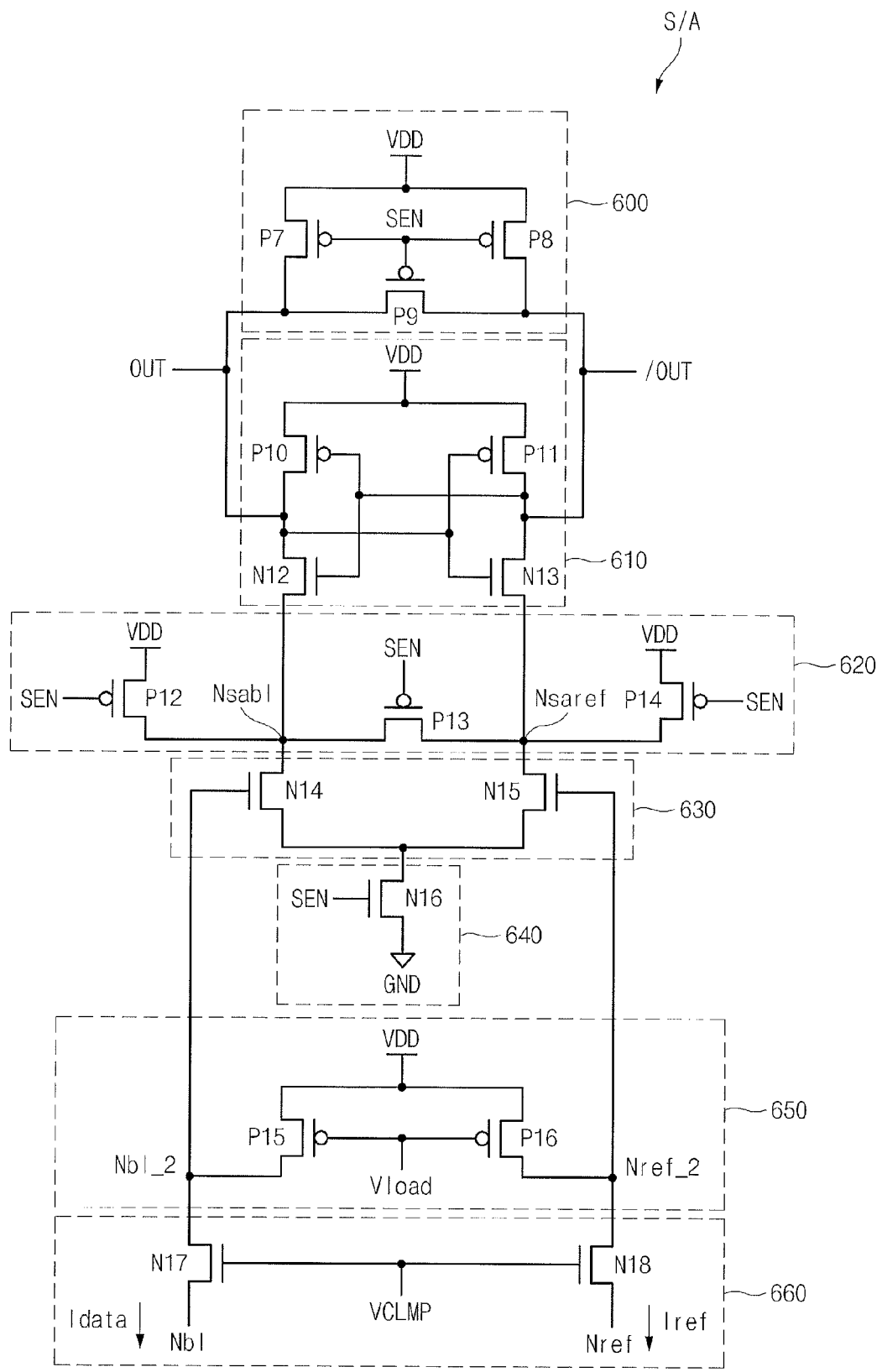
FIG. 11 is a diagram showing another embodiment of the sense amplifier of FIG. 4.

FIG. 11 is a diagram showing another embodiment of the sense amplifier of FIG. 4.

The sense amplifier S/A shown in FIG. 11 includes an equalizing unit 600, an amplifying unit 610, a pull-up unit 620, an amplifying unit 630, an amplifying activation control unit 640, a current sense load unit 650 and a bias control unit 660.

The equalizing unit 600 includes PMOS transistors P7~P9. The PMOS transistor P7 is connected between a power voltage VDD terminal and an output terminal OUT. The PMOS transistor P8 is connected between the power voltage VDD terminal and an output terminal /OUT. The PMOS transistor P9 is connected between the output terminals OUT, /OUT. The PMOS transistors P7~P9 have a common gate receiving a sense amplifier enable signal SEN.

The amplifying unit 610 includes PMOS transistors P10, P11 and NMOS transistors N12, N13. The PMOS transistors P10, P11 are cross-coupled with the NMOS transistors N12, N13. A source/drain of the PMOS transistor P10 and the NMOS transistor N12 are connected to the output terminal OUT, and a source/drain of the PMOS transistor P11 and the NMOS transistor N13 are connected to the output terminal /OUT.

The pull-up unit 620 includes PMOS transistors P12~P14. The PMOS transistor P12 is connected between the power voltage VDD terminal and a node Nsabl, and the gate of the PMOS transistor P12 receives the sense amplifier enable signal SEN. The PMOS transistor P14 is connected between the power voltage VDD terminal and a node Nsaref, and the gate of the PMOS transistor P14 receives the sense amplifier enable signal SEN. The PMOS transistor P13 is connected between the node Nsabl and the node Nsaref, and the gate of the PMOS transistor P13 receives the sense amplifier enable signal SEN.

The amplifying unit 630 includes NMOS transistors N14, N15. The NMOS transistor N14 is connected between the node Nsabl and an NMOS transistor N16, and the gate of the NMOS transistor N14 is connected to a node Nbl_2. The NMOS transistor N15 is connected between the node Nsaref and the NMOS transistor N16, and the gate of the NMOS transistor N15 receives a reference voltage Nref_2.

The amplifying activation control unit 640 includes the NMOS transistor N16. The NMOS transistor N16 is connected between the amplifying unit 630 and a ground voltage GND terminal, and the gate of the NMOS transistor N16 receives the sense amplifier enable signal SEN.

The current sense load unit 650 includes PMOS transistors P15, P16. The PMOS transistor P15 is connected between the power voltage VDD terminal and the node Nbl_2, and the gate of the PMOS transistor P15 receives a load voltage Vload. The PMOS transistor P16 is connected between the power voltage VDD terminal and the node Nref_2, and the gate of the PMOS transistor P16 receives the load voltage Vload.

The bias control unit 660 includes NMOS transistors N17, N18. The NMOS transistor N17 is connected between the node Nbl_2 and the node Nbl, and the gate of the NMOS transistor N17 receives a clamp voltage VCLMP. The NMOS transistor N18 is connected between the node Nref_2 and the node Nref, and the gate of the NMOS transistor N18 receives the clamp voltage VCLMP.

Figure 12:
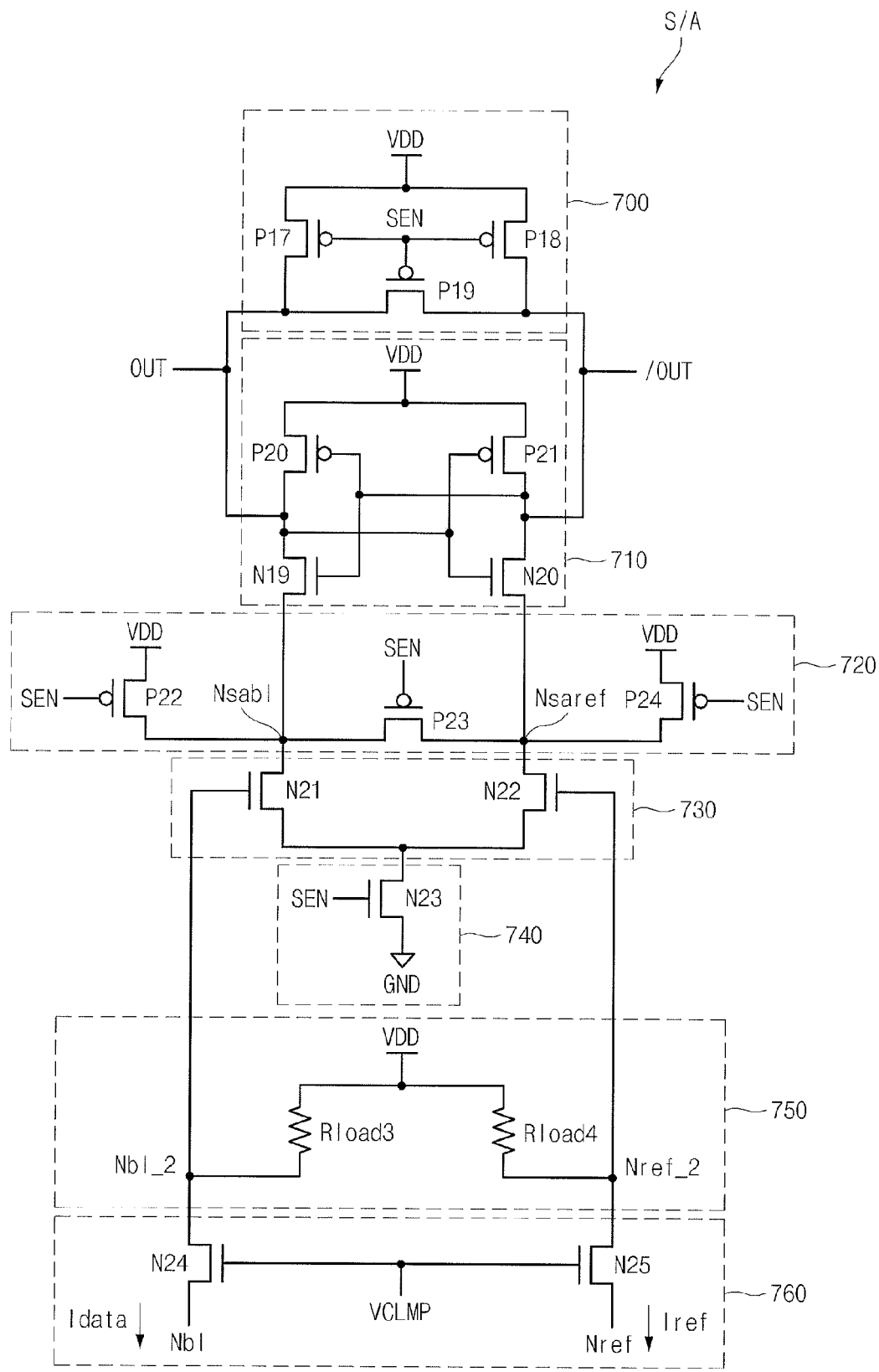
FIG. 12 is a diagram showing another embodiment of the sense amplifier of FIG. 4.

FIG. 12 is a circuit diagram showing another embodiment of the sense amplifier S/A of FIG. 4.

The sense amplifier S/A of FIG. 4 includes an equalizing unit 700, an amplifying unit 710, a pull-up unit 720, an amplifying unit 730, an amplifying activation control unit 740, a current sense load unit 750, and a bias control unit 760.

The equalizing unit 700 includes PMOS transistors P17~P19. The PMOS transistor P17 is connected between a power voltage VDD terminal and an output terminal OUT. The PMOS transistor P18 is connected between the power voltage VDD terminal and an output terminal /OUT. The PMOS transistor P19 is connected between the output terminals OUT, /OUT. The PMOS transistors P17~P19 have a common gate receiving a sense amplifier enable signal SEN.

The amplifying unit 710 includes PMOS transistors P20, P21 and NMOS transistors N19, N20. The PMOS transistors P20, P21 are cross-coupled with the NMOS transistors N19, N20. A source/drain of the PMOS transistor P10 and the NMOS transistor N12 are connected to the output terminal OUT, and a source/drain of the PMOS transistor P11 and the NMOS transistor N13 are connected to the output terminal /OUT.

The pull-up unit 720 includes PMOS transistor P22~P24. The PMOS transistor P22 is connected between the power voltage VDD terminal and a node Nsabl, and the gate of the PMOS transistor P22 receives the sense amplifier enable signal SEN. The PMOS transistor 24 is connected between the power voltage VDD terminal and a node Nsaref, and the gate of the PMOS transistor P24 receives the sense amplifier enable signal SEN. The PMOS transistor P23 connected between the node Nsabl and the node Nsaref, and the gate of the PMOS transistor P23 receives the sense amplifier enable signal SEN.

The amplifying unit 730 includes NMOS transistors N21, N22. The NMOS transistor N21 is connected between the node Nsabl and an NMOS transistor N23, and the gate of the NMOS transistor N21 is connected to a node Nbl_2. The NMOS transistor N22 is connected between the node Nsaref and the NMOS transistor N23, and the gate of the NMOS transistor N22 receives a reference voltage Nref_2.

The amplifying activation control unit 740 includes the NMOS transistor N23. The NMOS transistor N23 is connected between the amplifying unit 730 and a ground voltage GND terminal, and the gate of the NMOS transistor N23 receives the sense amplifier enable signal SEN.

The current sense load unit 750 includes load resistors Rload3, Rload4. The load resistor Rload3 is connected between the power voltage VDD terminal and the node Nbl_2. The load resistor Rload4 is connected between the power voltage VDD terminal and the node Nref_2.

The bias control unit 760 includes NMOS transistors N24, N25. The NMOS transistor N24 is connected between the node Nbl_2 and the node Nbl, and the gate of the NMOS transistor N24 receives a clamp voltage VCLMP. The NMOS transistor N25 is connected between the node Nref_2 and the node Nref, and the gate of the NMOS transistor N25 receives the clamp voltage VCLMP.

Figure 13:
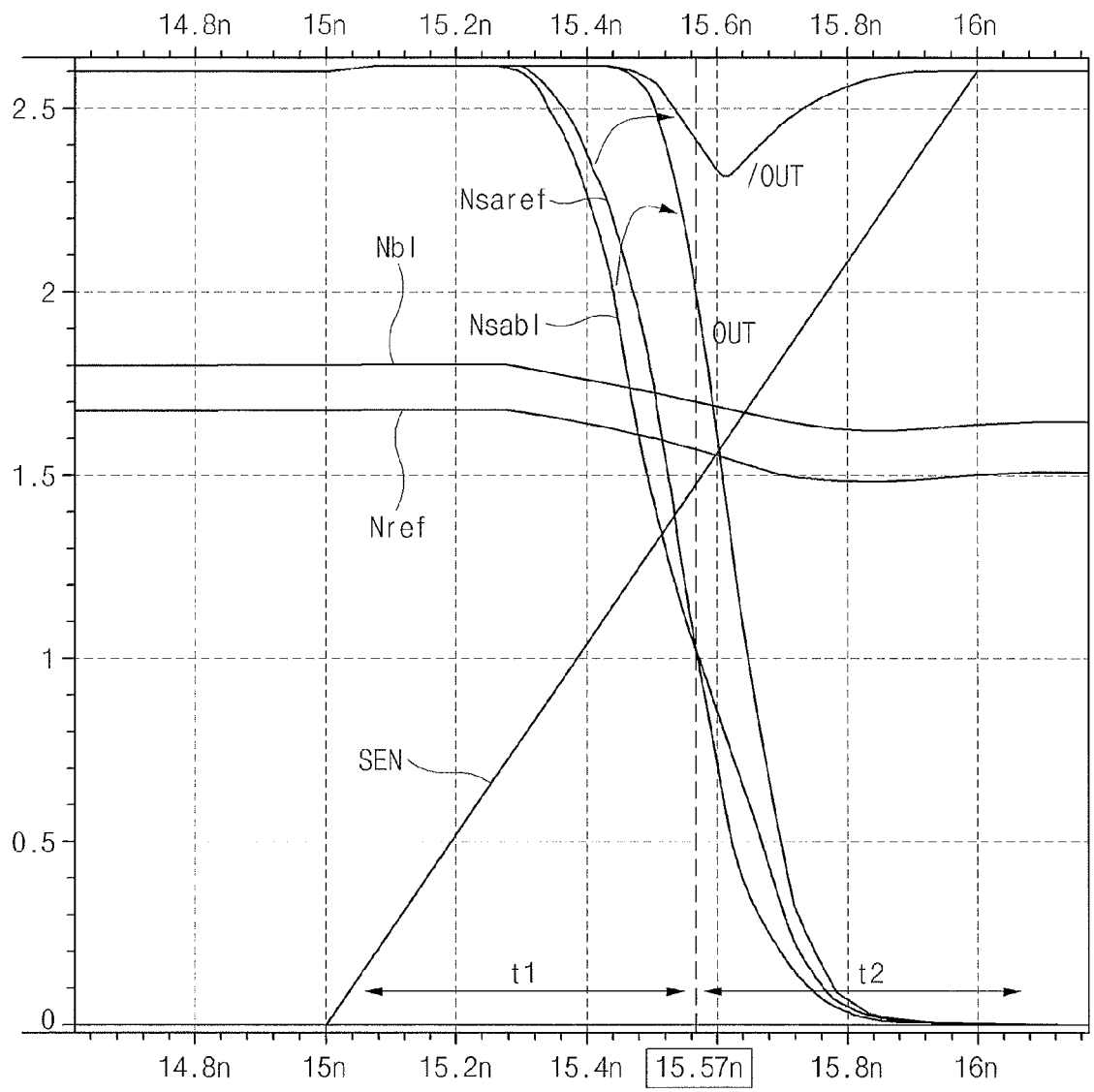
FIG. 13 is a waveform diagram shown for illustrating the amplifying units of the sense amplifier shown in FIG. 10.

FIG. 13 is a waveform diagram shown for illustrating the first and second amplifying units 510, 530 of the sense amplifier shown in FIG. 10.

When the clamp voltage VCLMP rises to a certain level, the NMOS transistors N10, N11 are turned on to transmit a data current Idata of the bit line BL to the node Nbl and a reference current Iref of the reference bit line to the node Nref. As can be gathered from FIG. 10, the gate voltage of the NMOS transistors N10, N11 is controlled by the clamp voltage VCLMP.

The current sense load unit 550 includes the load resistors Rload1, Rload2. A current of the bit line BL and the reference bit line is converted into sensing voltage values in the nodes Nbl_2, Nref_2 according to the load values of the load resistors Rload1, Rload2.

The amplifying activation control unit 540 is controlled by the sense amplifier enable signal SEN. The amplifying units 510, 530 are activated depending on the activation state of the amplifying activation control unit 540. The amplifying unit 530 amplifies values of the node Nbl_2 and the reference voltage Nref_2 with the gain of the NMOS transistors N7, N8.

Both ends of the nodes Nsabl, Nsaref are precharged to a high level during a precharge period according to the operation of the pull-up units 520 operation. The precharging process improves the first amplifying characteristic of the sense amplifier S/A. This improvement is shown, in that is during a period t1, both ends of the nodes Nsabl, Nsaref are pulled down to have an amplified voltage value. The voltage amplified in the amplifying unit 530 is transmitted to the amplifying unit 510, thereby improving a second amplifying characteristic of the sense amplifier S/A.

The amplifying unit 510 amplifies the gain of the amplifying unit 530 to improve the offset characteristic of the sense amplifier S/A. The equalizing unit 500 precharges the output signal of the amplifying unit 510 to a high level during the precharge period.

Figure 14:
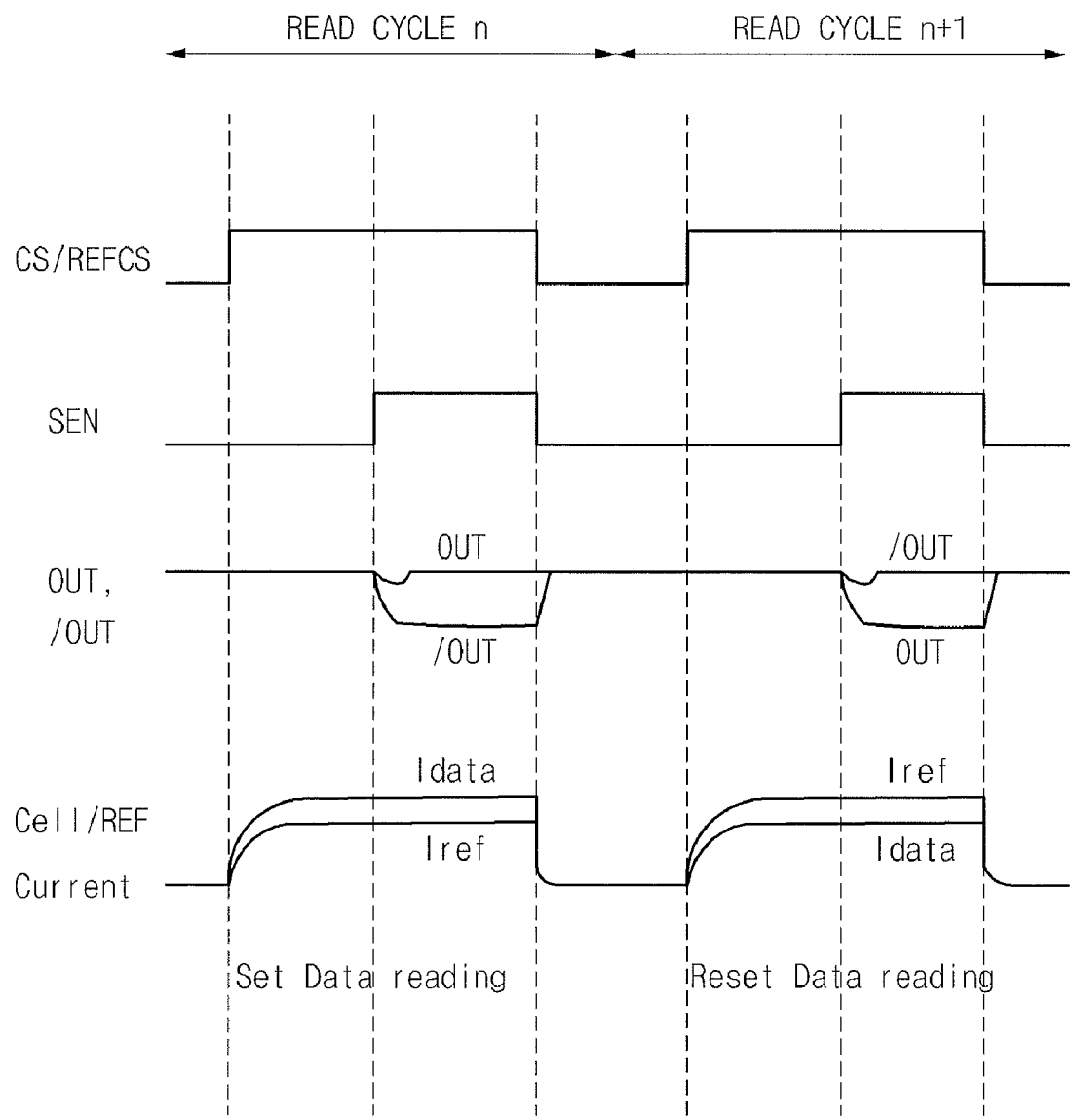
FIG. 14 is a timing diagram shown for illustrating the operating voltage of the sense amplifier of FIG. 10.

FIG. 14 is a timing diagram shown for illustrating an operating voltage of the sense amplifier of FIG. 10. FIG. 14 also shows the timing diagram of a current sensing operation of a data "1" and a data "0" in two read cycles.

In read cycle n, when a column selecting signal CS and the reference column selecting signal REFCS are activated, the data current Idata and the reference current Iref of the cell start to flow. After a predetermined time, the sense amplifier enable signal SEN is activated and the voltage of the output terminals OUT, /OUT is amplified. The data current Idata is larger than the reference current Iref; and therefore, the output terminal OUT is outputted at a high level, and the output terminal /OUT is outputted at a low level.

In read cycle n+1, when the column selecting signal CS and the reference column selecting signal REFCS are activated, the data current Idata and the reference current Iref of the cell start to flow. After a predetermined time, the sense amplifier enable signal SEN is activated, and the voltage of the output terminals OUT, /OUT is amplified. The data current Idata is smaller than the reference current Iref, and therefore, the output terminal OUT is outputted at a low level and the output terminal /OUT is outputted at a high level.

As described above, a phase change memory device according to an embodiment of the present invention improves the stability and accuracy of reference currents using a reference cell array in a phase change memory device having phase change resistors.

The phase change memory device also improves the sensing efficiency of a sense amplifier using a reference cell array having the same timing delay element in a phase change memory device having phase change resistors.

Additionally, the phase change memory device improves the offset characteristic of a sense amplifier in a phase change memory device having phase change resistors.

Although a number of illustrative embodiments consistent with the invention have been described, it should be understood that numerous other modifications and embodiments can be devised by those skilled in the art that fall within the spirit and scope of the principles of this disclosure. Particularly, numerous variations and modifications are possible in the component parts and/or arrangements which are within the scope of the disclosure, drawings, and the accompanying claims. In addition to variations and modifications in the component parts and/or arrangements, alternative uses will also be apparent to those skilled in the art.

What is claimed is:

1. A phase change memory device comprising:
    a cell array block comprising one or more phase change resistance cells, each phase change resistance cell being formed at an intersection of one or more word lines and one or more bit lines;
    a reference cell array block configured to output a reference current, the reference cell array block comprising one or more reference cells, each reference cell being formed at an intersection of a word line and a reference bit line;
    a column selecting unit connected to each of the one or more bit lines of the cell array block and configured to select one or more of the one or more bit lines connected to the cell array block;
    a reference column selecting unit connected to the reference bit line of the reference cell array block and configured to select the reference bit line; and
    a sense amplifier connected to the column selecting unit and the reference column selecting unit and amplifying according to the reference current of the reference cell array block and a cell data current of a bit line selected by the column selecting unit.

2. The phase change memory device according to claim 1, further comprising a reference resistor connected to the reference bit line between the reference column selecting unit and the sense amplifier.

3. The phase change memory device according to claim 1, wherein each of the one or more phase change resistance cells comprise:
    a phase change resistor configured to store data corresponding to a phase change, wherein the phase change occurs depending on the level of a current applied to the phase change resistor; and
    a diode element connected between the phase change resistor and the corresponding word line.

4. The phase change memory device according to claim 1, wherein each of the one or more reference cells comprises diode elements connected between the reference bit line and a word line.

5. The phase change memory device according to claim 4, wherein the reference cell array block further comprises a phase change resistor configured to store data corresponding to a phase change occurring depending on the current flowing through the phase change resistor.

6. The phase change memory device according to claim 4, wherein the diode element is a PN diode having a P-type region connected to the reference bit line and a N-type region connected to the word line.

7. The phase change memory device according to claim 1, wherein the column selecting unit comprises one or more column selecting switches, wherein one of the column selecting switches is connected between each of the one or more bit lines and the sense amplifier and each column selecting switch is controlled by a column selecting signal.

8. The phase change memory device according to claim 7, wherein the column selecting switch comprises an NMOS transistor.

9. The phase change memory device according to claim 1, wherein the reference column selecting unit comprises a column selecting switch connected between the reference bit line and the sense amplifier and controlled by a reference column selecting signal.

10. The phase change memory device according to claim 9, wherein the reference column selecting switch comprises an NMOS transistor.

11. The phase change memory device according to claim 1, wherein a single sense amplifier is shared by the one or more bit lines.

12. The phase change memory device according to claim 1, wherein a reset resistance value of the bit line is larger than a reference resistance and a set resistance is smaller than the reference resistance.

13. The phase change memory device according to claim 1, wherein a reset current flowing in the bit line is smaller than the reference current and a set current is larger than the reference current.

14. The phase change memory device according to claim 1, wherein the sense amplifier comprises:
    an equalizing unit configured to precharge an output terminal of the sense amplifier during a precharge period;
    an amplifying unit configured to amplify a voltage of the output terminal according to voltage levels of a bit line voltage terminal and a reference voltage terminal;
    a pull-up unit configured to perform a pull up operation on input nodes of the amplifying unit during the precharge period;
    an amplifying activation control unit configured to control activation of the amplifying unit in response to a sense amplifier enable signal;
    a current sense load unit configured to convert the cell data current and the reference current into voltage levels of a bit line node and a reference node; and
    a bias control unit configured to control the reference current and the cell data current according to a clamp voltage.

15. The phase change memory device according to claim 14, wherein the amplifying unit comprises:
    a first amplifying unit configured to amplify voltages of the bit line node and the reference node; and
    a second amplifying unit configured to amplify a voltage of the first amplifying unit.

16. The phase change memory device according to claim 14, wherein the pull-up unit comprises a first PMOS transistor connected between the input nodes, wherein a gate of the first PMOS transistor receives the sense amplifier enable signal.

17. The phase change memory device according to claim 16, wherein the pull-up unit further comprises:
    a second PMOS transistor connected between a power voltage terminal and the bit line node, wherein a gate of the second PMOS transistor receives the sense amplifier enable signal; and
    a third PMOS transistor connected between the power voltage terminal and the reference node, wherein a gate of the third PMOS transistor receives the sense amplifier enable signal.

18. The phase change memory device according to claim 14, wherein the current sense load unit comprises:
- a first load resistor connected between a power voltage terminal and the bit line node; and
- a second load resistor connected between the power voltage terminal and the reference node.

19. The phase change memory device according to claim 14, wherein the current sense load unit comprises:
- a fourth transistor connected between a power voltage terminal and the bit line node and having a gate receiving a load voltage; and
- a fifth transistor connected between the power voltage terminal and the reference node and having a gate receiving the load voltage.

20. A phase change memory device comprising:
- a plurality of cell array blocks, each cell array block comprising one or more phase change resistance cells formed at an intersection of a word line and a bit line;
- a plurality of column selecting units, each column selecting unit being connected to one of the cell array blocks and being configured to select one or more of the one or more bit lines connected to the one cell array block;
- a single reference cell array block configured to output a reference current, the reference cell array block comprising one or more reference cells, each reference cell being formed at an intersection of a word line and a reference bit line;
- a reference column selecting unit connected to the reference bit line of the single reference cell array block and configured to select the reference bit line; and
- a plurality of sense amplifiers, each sense amplifier being connected to one of the column selecting units and the single reference column selecting unit, and each sense amplifier amplifying according to the reference current of the single reference cell array block and a cell data current of a bit line selected by the column selecting unit.

21. A phase change memory device comprising:
- a plurality of cell array blocks, each cell array block comprising one or more phase change resistance cells formed at an intersection of a word line and a bit line;
- a plurality of column selecting units, each column selecting unit being connected to one of the cell array blocks and being configured to select one or more of the one or more bit lines of the connected cell array block;
- a plurality of reference cell array blocks each reference cell array block corresponding to one of the cell array blocks, wherein each reference cell array block is configured to output a reference current and each reference cell array block comprises one or more reference cells, each reference cell being formed at an intersection of a word line and a reference bit line;
- a plurality of reference column selecting units, each reference column selecting unit being connected to one of the reference cell array blocks and being configured to select the reference bit line of the connected reference cell array block; and
- a plurality of sense amplifiers, each sense amplifier being connected to one of the column selecting units and the corresponding reference column selecting unit, and each sense amplifier amplifying according to the reference current of the reference bit line and a cell data current of a bit line selected by the column selecting unit.

* * * * *